United States Patent
Byles (10) Patent No.: US 11,078,632 B2
(45) Date of Patent: Aug. 3, 2021

(54) LANDSCAPE PAVERS FOR GROUND INSTALLATION OF PHOTOVOLTAIC PANELS

(71) Applicant: Solar Hardscapes LLC, Dallas, TX (US)

(72) Inventor: Joe Don Byles, New Braunfels, TX (US)

(73) Assignee: Solar Hardscapes, LLC, Dallas, TX (US)

( * ) Notice: Subject to any disclaimer, the term of this patent is extended or adjusted under 35 U.S.C. 154(b) by 0 days.

(21) Appl. No.: 16/803,898

(22) Filed: Feb. 27, 2020

(65) Prior Publication Data

US 2020/0199826 A1    Jun. 25, 2020

Related U.S. Application Data (63) Continuation of application No. PCT/US2019/045251, filed on Aug. 6, 2019.
(Continued)

(51) Int. Cl.
*E01C 5/22* (2006.01)
*H02S 20/10* (2014.01)
*H02S 30/10* (2014.01)

(52) U.S. Cl.
CPC ............ *E01C 5/22* (2013.01); *H02S 20/10* (2014.12); *H02S 30/10* (2014.12)

(58) Field of Classification Search
CPC ................................. F21S 8/032; F21S 11/00
(Continued)

(56) References Cited

U.S. PATENT DOCUMENTS

| 2,428,537 A | * | 10/1947 | Veszi | H01L 21/08 |
| | | | | 136/244 |
| 4,132,074 A | * | 1/1979 | Wendel | F24S 20/02 |
| | | | | 60/641.8 |

(Continued)

FOREIGN PATENT DOCUMENTS

| DE | 3247468 A1 | 7/1984 |
| DE | 19958053 A | 11/2003 |

(Continued)

OTHER PUBLICATIONS

PCTUS2019045251 International Search Report and Written Opinion, dated Dec. 4, 2019.
(Continued)

*Primary Examiner* — Thomas B Will
*Assistant Examiner* — Katherine J Chu
(74) *Attorney, Agent, or Firm* — The Culbertson Group, P.C.; Russell D. Culbertson (57) ABSTRACT

A landscape paver includes a PV panel and a frame. The PV panel includes one or more PV cells and is operable to provide electrical power at a panel output terminal in response to operating light incident on a panel upper surface. The frame extends along the panel peripheral edge and defines a frame inside surface which, together with a lower panel surface, defines a base volume. A molded base material is located in the base volume. A light-transmissive paver cover material extends over the panel first surface and over at least a portion of a frame outside surface which faces away from the base volume. The landscape paver may be incorporated in a landscape installation and connected with other such pavers in the installation to provide a ground mounted PV panel array which also functions as a hardscape such as a walkway or patio.

20 Claims, 5 Drawing Sheets

Related U.S. Application Data (60) Provisional application No. 62/764,495, filed on Aug. 6, 2018.

(58) Field of Classification Search
USPC .................................. 362/153.1; 52/173.3
See application file for complete search history.

(56) References Cited

U.S. PATENT DOCUMENTS

| | | | |
|---|---|---|---|
| 4,164,933 A * | 8/1979 | Alosi | F24D 3/14 |
| | | | 126/621 |
| 4,267,822 A | 5/1981 | Diamond | |
| 4,326,012 A | 4/1982 | Charlton | |
| 4,396,665 A | 8/1983 | Rowe | |
| 4,526,162 A * | 7/1985 | Arai | F24S 80/60 |
| | | | 126/709 |
| 4,636,578 A | 1/1987 | Feinberg | |
| 4,843,525 A | 6/1989 | Williams | |
| 4,860,509 A | 8/1989 | Laaly | |
| 4,898,153 A | 2/1990 | Sherwood | |
| 4,904,998 A | 2/1990 | Niimi | |
| 4,993,868 A | 2/1991 | Eigenmann | |
| 5,041,762 A | 8/1991 | Hartai | |
| 5,074,706 A | 12/1991 | Paulo | |
| 5,185,042 A | 2/1993 | Ferguson | |
| 5,213,627 A | 5/1993 | Marquardt | |
| 5,308,187 A | 5/1994 | Nix | |
| 5,575,861 A | 11/1996 | Younan | |
| 5,673,039 A | 9/1997 | Pietzsch | |
| 5,741,370 A * | 4/1998 | Hanoka | H02S 20/20 |
| | | | 136/251 |
| 5,984,570 A | 11/1999 | Parashar | |
| 5,986,203 A * | 11/1999 | Hanoka | B32B 17/10302 |
| | | | 136/251 |
| 6,027,280 A | 2/2000 | Conners | |
| 6,201,179 B1 | 3/2001 | Dalacu | |
| 6,210,017 B1 | 4/2001 | Miura | |
| 6,339,188 B1 * | 1/2002 | Voelkner | E01C 17/00 |
| | | | 136/251 |
| 6,354,714 B1 | 3/2002 | Rhodes | |
| 6,446,625 B1 | 9/2002 | Tinari | |
| 6,602,021 B1 | 8/2003 | Kim | |
| 6,655,814 B1 | 12/2003 | Tagawa | |
| 6,670,541 B2 * | 12/2003 | Nagao | H02S 30/10 |
| | | | 136/251 |
| 6,831,221 B2 | 12/2004 | Hulen | |
| 6,928,775 B2 | 8/2005 | Banister | |
| 6,932,489 B2 | 8/2005 | Sooferian | |
| 7,318,655 B2 | 1/2008 | Sooferian | |
| 7,901,991 B2 * | 3/2011 | Bonucci | H01L 31/048 |
| | | | 257/682 |
| 8,319,093 B2 | 11/2012 | Kalkanoglu | |
| 8,540,390 B2 * | 9/2013 | Kotulla | G02B 6/0008 |
| | | | 362/153 |
| 8,907,202 B1 * | 12/2014 | Brusaw | H01L 31/0488 |
| | | | 136/244 |
| 8,919,052 B2 * | 12/2014 | West | H02S 20/23 |
| | | | 52/173.3 |
| 8,919,077 B2 * | 12/2014 | Keller | H02J 7/35 |
| | | | 52/747.12 |
| 9,777,948 B2 * | 10/2017 | Braunstein | H02S 20/23 |
| 10,030,337 B2 | 7/2018 | Kim | |
| 10,181,541 B2 | 1/2019 | Moslehi | |
| 10,298,171 B2 | 5/2019 | Almy | |
| 10,615,300 B2 * | 4/2020 | Inaba | H01L 31/048 |
| 2003/0000566 A1 | 1/2003 | Matsushita | |
| 2003/0090896 A1 | 5/2003 | Sooferian | |
| 2003/0137831 A1 * | 7/2003 | Lin | F21S 8/022 |
| | | | 362/183 |
| 2003/0154666 A1 | 8/2003 | Dinwoodie | |
| 2005/0199282 A1 * | 9/2005 | Oleinick | H01L 31/048 |
| | | | 136/256 |
| 2005/0238426 A1 * | 10/2005 | Seroka | B28B 1/002 |
| | | | 404/34 |
| 2005/0238911 A1 * | 10/2005 | Sturley | F21K 2/00 |
| | | | 428/690 |
| 2005/0279400 A1 * | 12/2005 | Banister | H02S 40/425 |
| | | | 136/244 |
| 2006/0093853 A1 | 5/2006 | Sturley | |
| 2007/0240754 A1 | 10/2007 | Gayout | |
| 2010/0126549 A1 | 5/2010 | Ryu | |
| 2011/0019351 A1 * | 1/2011 | Bayne | G02F 1/133308 |
| | | | 361/679.01 |
| 2011/0262635 A1 * | 10/2011 | Hill | E01F 9/559 |
| | | | 427/157 |
| 2012/0106194 A1 * | 5/2012 | Ashoff | G02B 6/0078 |
| | | | 362/602 |
| 2012/0233940 A1 * | 9/2012 | Perkins | H02S 20/23 |
| | | | 52/173.3 |
| 2013/0092231 A1 * | 4/2013 | Kung | H01L 31/044 |
| | | | 136/259 |
| 2014/0000186 A1 * | 1/2014 | Yen | F16B 5/0635 |
| | | | 52/173.3 |
| 2014/0137489 A1 * | 5/2014 | Habdank | F24S 25/615 |
| | | | 52/173.3 |
| 2015/0121780 A1 * | 5/2015 | Beltran Albarran | |
| | | | E04F 15/02172 |
| | | | 52/173.3 |
| 2015/0144580 A1 * | 5/2015 | Kitano | H02S 20/10 |
| | | | 211/41.17 |
| 2015/0381106 A1 * | 12/2015 | Fujikawa | H02S 20/00 |
| | | | 136/251 |
| 2016/0036917 A1 | 2/2016 | Koravadi | |
| 2016/0043686 A1 * | 2/2016 | Hsueh | H02S 20/23 |
| | | | 52/60 |
| 2016/0111999 A1 * | 4/2016 | Stapleton | F24S 25/61 |
| | | | 52/173.3 |
| 2016/0301355 A1 * | 10/2016 | Small | H01L 31/048 |
| 2016/0380856 A1 | 12/2016 | Ben Hamida | |
| 2017/0104426 A1 | 4/2017 | Mills | |
| 2018/0102730 A1 | 4/2018 | Brusaw | |
| 2018/0123504 A1 | 5/2018 | Almy | |
| 2018/0130921 A1 | 5/2018 | Mayer | |
| 2018/0254738 A1 | 9/2018 | Yang | |
| 2018/0269824 A1 | 9/2018 | Mayer | |
| 2018/0351501 A1 | 12/2018 | Seery | |
| 2018/0351502 A1 | 12/2018 | Almy | |
| 2019/0028055 A1 | 1/2019 | Yang | |
| 2019/0058436 A1 | 1/2019 | Atchley | |
| 2019/0371952 A1 * | 12/2019 | Zhou | H01L 31/048 |
| 2020/0162017 A1 * | 5/2020 | Cassagne | H02S 30/10 |
| 2020/0287502 A1 * | 9/2020 | Sewalt | H02S 40/36 |

FOREIGN PATENT DOCUMENTS

| | | | | |
|---|---|---|---|---|
| DE | 102006043850 A1 * | 3/2008 | | E04F 11/166 |
| EP | 1401026 A1 | 3/2004 | | |
| EP | 3490008 A1 * | 5/2019 | | H01L 31/048 |
| JP | 8242711 | 9/1996 | | |
| JP | 09018041 | 1/1997 | | |
| JP | 2002118279 A | 4/2002 | | |
| KR | 200333957 Y1 | 11/2003 | | |
| WO | 8702400 A1 | 4/1987 | | |
| WO | 9715953 A1 | 5/1997 | | |
| WO | 03031722 A1 | 4/2003 | | |
| WO | 2003097954 A1 | 11/2003 | | |
| WO | 2008018672 A1 | 2/2008 | | |
| WO | 2017095050 A1 | 6/2017 | | |
| WO | WO-2018205034 A1 * | 11/2018 | | H01L 27/142 |

OTHER PUBLICATIONS

Platio Solar Pavers Fuel Electric Cars with Clean Energy, https://youtu.be/TQWJ4H7f70I, retrieved Feb. 1, 2018.

Solar Roadways. "Specifics: Electrical," http://web.archive.org/web/20160817120359/http://www.solarroadways.com/Specifics/Electrical, Web Archive from Aug. 17, 2016.

* cited by examiner

LANDSCAPE PAVERS FOR GROUND INSTALLATION OF PHOTOVOLTAIC PANELS

CROSS-REFERENCE TO RELATED APPLICATION

This application claims the benefit, under 35 U.S.C. § 120, of PCT International Patent Application No. PCT/US2019/045251 filed Aug. 6, 2019 and entitled "LANDSCAPE PAVERS FOR GROUND INSTALLATION OF PHOTOVOLTAIC PANELS, LANDSCAPE PAVER INSTALLATIONS, AND INSTALLATION METHODS," which claimed the benefit, under 35 U.S.C. § 119, of U.S. Provisional Patent Application No. 62/764,495 filed Aug. 6, 2018 and entitled "APPARATUS AND METHOD OF LIGHT PERMEABLE LANDSCAPE PAVER FOR GROUND INSTALLATION OF PHOTOVOLTAIC MODULE ARRAY." The entire content of each of these prior patent applications is incorporated herein by this reference.

TECHNICAL FIELD OF THE INVENTION

The invention relates to photovoltaic panels and photovoltaic panel systems, and, more particularly, to photovoltaic panels and photovoltaic panel arrays which may be integrated into landscape features such as a walkway or patio hardscapes for example. The invention includes pavers having an integrated photovoltaic panel, pavers to be used with separate photovoltaic panels to produce a hardscape capable of electric power generation, and hardscape installations capable of electric power generation though photovoltaic devices.

BACKGROUND OF THE INVENTION

A photovoltaic (PV) cell generates electricity in response to light striking a surface of the cell material. In particular, a PV cell may be placed in sunlight to generate electricity from the sunlight striking the cell. Individual PV cells may be arranged in groups in a sheet of material to form a PV panel capable of generating a useful amount of electricity for storage or for immediate use in electrically powered devices. PV generating capacity has grown exponentially within the past few decades and is an ever-increasing percentage of distributed energy production within the United States and around the world.

PV panel arrays are commonly installed on commercial and residential rooftops to make use of that area for power generation. For low-slope roofs (commonly defined as having no more than four inches of rise over every twelve inches of run) a PV panel array may be installed with a racking system that is ballasted with weights to hold it down. There is no need for any rooftop penetrations in these low-slope roofs because the PV panels and racking are held by the weight of the ballast rather than a mechanical attachment to the roof structure. For steep-sloped roofs (commonly defined as having over four inches of rise for every twelve inches of run) PV panel array installation requires a racking system that must be mechanically attached to the roof structure. This mechanical attachment generally requires penetrations to be drilled through the rooftop, so that the system can be bolted to the underlying building structure. The hardware of the penetration is then flashed and waterproofed to the extent possible to prevent leakage.

Both low-slope and steep-sloped roof PV panel installations present problems, both practical and aesthetic. First, any rooftop PV panel installation that requires roof penetrations presents the problem of potential leakage and expensive repairs for leakage damage within the structure and for preventing further leakage. With regard to steep-sloped shingle roofs, the roof penetration and hardware installation may break the mastic sealant which helps hold the rows of shingles in place during high wind events, and thus leave the roof prone to wind damage. While ballasted PV panel racking systems which may be installed on low-slope roofs are typically less expensive to install and may be installed relatively quickly, the ballast weight adds to the load on the roof structure and thus the roof structure must be designed to take the added load. For some buildings a ballasted PV panel racking system may only be added after the building structure is modified to properly support the added weight. Both low-slope and steep-slope roof PV panel installations must also be designed for high and variable wind conditions and dangers from seismic events, and must be tested in order to be certified to UL standards for resistance to wind and seismic events. Additionally, rooftop PV panel installations present relatively dangerous working conditions both for installation work and maintenance since the installations are necessarily at height. The danger for workers is particularly acute for steep-slope installations where a worker may easily slide off the roof and suffer a debilitating or even fatal fall. Rooftop PV panel installations also present problems when maintenance is required for the roof or the roofing material must be replaced. Such roofing repair or replacement may require the entire rooftop PV panel array to be removed and then reinstalled once the roofing repair or replacement is done.

In both low-slope and steep-slope roof installations, the PV panels provide a visual distraction to the roofing surface and the building aesthetic. This is particularly the case for steep-slope roof installations where the PV panels are clearly visible from generally every viewpoint to the building. Even in low-slope PV panel installations, some or all of at least some of the PV panels or the racking system may be visible from at least some points of view to the building and may affect the building aesthetics.

There have been a number of attempts to minimize the visual impact of the PV panel array in rooftop installations. U.S. Pat. No. 8,319,093 discloses a PV module particularly for use in rooftop installations. The PV module, which may include a number of individual PV cells, includes a color layer with pigments that cause the PV module to simulate conventional roofing. Another attempt to make a rooftop PV installation less apparent and visible is to incorporate the PV cells into a roofing material or shingle that is applied into a field of conventional roofing material. This approach is illustrated by Dow Powerhouse® shingles. However, these types of shingles do not blend in well with surrounding roofing shingles, and this may cause the installation to have a negative impact on the building aesthetics. Another drawback of incorporating PV cells into a roofing shingle is that it greatly multiplies the number of electrical connections that must be made in the PV installation, which increases both points of potential failure and installation labor. Yet another drawback of incorporating PV cells into roofing shingles is the heat build-up occasioned by having the PV cells directly on the roof deck and roofing underlayment with no means of cooling the cells. Conventional PV panel array installations rely on air flow beneath each PV panel to isolate the PV cells from the rooftop temperatures which can reach fifty to one hundred degrees hotter than the ground ambient temperature. Preventing undue heat buildup in a PV cell is important because the heat buildup can lead to a large drop in output from the PV cell.

Yet another attempt to hide PV rooftop installations has been developed by Tesla Corporation where the PV cells are incorporated into glass shingles of tiles and these PV-integrated shingles or tiles are installed together with "blank" shingles or tiles which do not incorporate PV cells. This arrangement is intended to provide a single continuous appearance across the entire roofing installation. However, this system requires a large amount of electrical connections and also suffers from the heat buildup problem described above. In addition, the shingles or tiles are relatively heavy and require that the underlying structure be designed to accommodate the additional weight of the roofing material. The labor to install such a system is also more than a standard roof and the economics of the roofing material and labor may make it cost prohibitive.

All rooftop PV device installations also have the disadvantage of having to meet strict code requirements of electrical, fire, mechanical, and other regulations that are triggered when they are placed upon rooftops. If one does not want to deal with the restrictions, limitations and costs associated with mounting a PV panel array on a rooftop, one could consider a ground mounted system where the array is placed on elevating poles or structure on adjacent ground area to the building. However, a major limitation of such elevated ground installations is that residential homes have limited area that is typically reserved for lawns, patios, sidewalks and other features demanded by residential homeowners. Commercial properties too may have limited free ground area for such elevated ground PV panel array installations. Furthermore, elevated ground PV panel arrays in a residential or commercial setting can be more aesthetically distracting than a roof mounted array.

U.S. Published Patent Application No. 2005/0199282 by Oleinick et al. and U.S. Published Patent Application No. 2018/0102730 by Brusaw et al. both disclose PV panel assemblies which may be used for paving roads, driveways, and walkways. These panel assemblies, however, have a distinctively non-traditional appearance and do not provide a cost-effective or aesthetically pleasing installation that would be readily accepted by commercial building owners or home owners.

SUMMARY OF THE INVENTION

It is an object of the invention to provide devices and systems which overcome the above-noted problems and others associated with PV panel installations. These problems are addressed by providing landscape pavers for ground installation of PV panels and by providing landscape paver and PV panel installations and installation methods. By facilitating the installation of PV panels in landscape features such as walkway and patio hardscapes, for example, the pavers and installations according to the present invention allow these hardscape areas to be used for electrical power generation without interfering with the property aesthetics and without taking up property area only for such power generation.

A landscape paver according to one aspect of the present invention includes a PV panel and a rigid frame. The PV panel has a panel first surface and a panel second surface each bounded by a panel peripheral edge. The PV panel includes one or more PV cells and is operable to provide electrical power at a panel output terminal in response to operating light incident on the panel first surface. The rigid frame extends along the panel peripheral edge and defines a frame inside surface which, together with the panel second surface, defines a base volume. A molded base material is located in the base volume with a base material backing surface molded against at least a portion of the panel second surface and a base material lateral surface molded against at least a portion of the frame inside surface. A light-transmissive paver cover material extends over the panel first surface and preferably over at least a portion of a frame outside surface which faces away from the base volume.

In a paver structure according to this first aspect of the invention, the molded base material provides a rigid support for the PV panel which allows the paver to be placed on the ground or a prepared sand bed. The rigid frame provides a form for receiving the base material in the manufacture of the paver. The light-transmissive paver cover material extending over the panel first surface provides a tough and wear-resistant material to protect the panel first surface from footsteps and the weight of objects placed on the installed paver. However, light and sunlight in particular may still penetrate through the paver cover material to reach the PV panel first surface and cause the panel to generate electricity. Thus a paver according to this first aspect of the invention may be installed in a landscape, preferably with other such pavers, and the panel output terminal connected to provide electrical generation for current use or storage in an electrical storage system such as a battery system.

As used in this disclosure and the accompanying claims, the designation "PV panel" refers to a device having one or more PV cells which produce a photovoltaic effect in response to operating light incident on a surface of the cell. "Operating light" is used herein to refer to the level of light needed for the PV cell to produce the photovoltaic effect. Such PV cells may be formed in any fashion using any photovoltaic material technology now known or developed in the future. For example, a solar cell which may be used in a PV panel in accordance with the present invention may comprise a monocrystalline, polycrystalline, or amorphous silicon cell, thin film PV cell, multi junction PV cell, or any other type of PV cell. In accordance with current manufacturing techniques, a number of PV cells which individually provide a small light collection area are typically connected together to form a PV panel which overall provides a large light collection area. However, the designation "PV panel" as used in this disclosure and accompanying claims is not limited to such multiple PV cell arrangements. Also a PV panel as used in this disclosure will commonly include a sheet of backing material and a sheet of transparent upper surface material in the PV panel structure. These backing and upper surface materials serve to protect the PV cells, conductor traces, and other electronic elements which may be included with the PV cells.

The designation "light-transmissive" as used in this disclosure and the accompanying claims means that the material or structure is capable of transmitting operating light to the collection surface of a PV cell, that is, sufficient light to, when the light is incident on the surface of a PV cell, cause the PV cell to generate electricity. A light-transmissive material need not transmit all wavelengths equally, and may essentially block or greatly attenuate some wavelengths in the spectrum of sunlight. Regardless of any such wavelength transmissivity preference, sufficient light at a given wavelength may pass through the light-transmissive material in the thicknesses used in the structures described herein to cause a PV cell operable on that wavelength to produce the photovoltaic effect to generate electricity. Of course, implementations according to the various aspects of the invention may use highly light-transmissive materials to allow for higher levels of electricity generation from installations according to the present invention.

The present disclosure and accompanying claims may use terms such as top, bottom, side, lateral, upper, and lower in reference to a certain feature or structure. These relative positional terms are used with reference to the orientation of the example pavers and paver installations shown in the drawings.

In some implementations of a paver according to the first aspect of the invention, the rigid frame includes a panel support flange extending from the frame inside surface. This panel support flange defines a peripheral sealing surface abutting a portion of one of the panel first surface and panel second surface to facilitate the containment of the base material as it is introduced into the base volume during the molding process. In addition to the panel support flange, the paver may include a panel capture flange to form a panel receiving channel which receives the peripheral edge of the PV panel.

Regardless of how the PV panel is positioned or connected to the frame prior to introduction of the material which forms the molded base material of a paver according to the first aspect of the invention, a portion of the frame may be exposed on a bottom surface of the paver. Where the frame is formed from an electrically conductive material, this exposed portion of the frame provides a grounding point for the paver.

Implementations of a paver according to the first aspect of the invention may also include reinforcing elements embedded in the molded base material to enhance the strength of the composite structure made up of the PV panel, frame, molded base material, and cover material. Such reinforcing elements may be included in spaced apart layers of reinforcing fibers or other elements within the thickness of the molded base material and may extend substantially parallel to the panel plane defined by the PV panel first surface.

The paver cover material included in pavers according to the first aspect of the invention may be a material molded on to the PV panel and frame. In this case, a layer of the molded cover material defines a lower cover material surface which is molded against the panel first surface and defines a cover material upper surface facing away from the panel first surface. Also in these molded cover material embodiments, a cover material lateral surface may be molded against the frame outside surface.

A paver according to the first aspect of the invention may include at least one reduced light transmissivity layer located in the cover material between a paver load receiving surface and the panel first surface. Any such reduced light transmissivity layer is formed from a light-transmissive material in which is included low-light-transmissivity granular material. "Low-light-transmissivity" in this sense and as used elsewhere in this disclosure and the accompanying claims means that the granular material transmits less than approximately 50% of incident light in the operating spectrum of the given PV panel. This low-light-transmissivity granular material serves to provide an appearance to the paver that may mimic a traditional landscape paver of concrete, stone, or other traditional paver material. The appearance may be enhanced by the color presented by the panel first surface visible through the light transmissive cover material and by granular material which exhibits a light transmissivity greater than a low-light-transmissivity material and may be included in the reduced light transmissivity layer or elsewhere in the paver above the PV panel. In some cases the low-light-transmissivity granular material may be suspended in the reduced light transmissivity layer, or may be embedded in the paver load receiving surface, or both. In any event the low-light-transmissivity granular material is preferably present in such a concentration that it reduces the light transmissivity of the reduced light transmissivity layer by no more than approximately 10%. That is, the concentration of low-light-transmissivity material in the reduced light transmissivity layer is preferably limited to a concentration in which the low-light-transmissivity material reduces the light transmissivity of the layer by no more than approximately 10% as compared to a case in which no low-light-transmissivity material was included in the layer. Also, the grains which make up the low-light-transmissivity granular material may be limited to a certain size ranges to produce the desired appearance while avoiding undue impact on the amount of light which may reach the PV panel.

According to a second aspect of the invention, a landscape paver may be configured to be installed with a PV panel to form a hardscape such as a walkway or patio, for example, capable of generating electrical power. A paver according to this second aspect of the invention includes a paver body defined between a paver load receiving surface, a paver bottom surface, and a paver lateral surface. The paver body and at least the paver load receiving surface and paver bottom surface are light-transmissive so that at least some light incident on the paver load receiving surface travels through the paver body and escapes from the paver through the paver bottom surface. A paver according to this second aspect of the invention may also include at least one reduced light transmissivity layer extending transverse to a direction from the paver load receiving surface to the paver bottom surface. This at least one reduced light transmissivity layer may comprise a layer of material similar to that described above in connection with the first aspect of the invention, with all of the variations for the low-light-transmissivity granular material described above applying as well to this second aspect of the invention.

Regardless of whether a paver according to the second aspect of the invention includes a low-light-transmissivity granular material, such a paver may be configured to be placed directly upon a PV panel in a PV panel installation as described below. In these configurations the paver body includes an upper assembly and a lower assembly. The upper assembly includes one or more layers of light-transmissive material while the lower assembly comprises a light-transmissive elastomer which includes the paver bottom surface. This elastomer which forms the paver bottom surface provides a degree of cushioning to the PV panel below and serves to accommodate any protruding features of the PV panel.

A third aspect of the invention encompasses a PV panel installation which may employ pavers according to either one of the first and second aspects of the invention. A PV panel installation according to this third aspect of the invention includes a PV panel supporting bed and a moisture introduction arrangement in fluid communication with the PV panel supporting bed. The PV panel supporting bed in these installations is formed as a layer of granular material such as a layer of paver sand which produces a porous and permeable layer of material above a suitable subgrade. At least one PV panel is set in the PV panel supporting bed with the panel second surface facing the PV panel supporting bed and with the panel first surface facing upwardly. A light-transmissive load bearing surface layer is located above the at least one PV panel in position to receive a force (such as a force from footsteps on the paver) and transmit the force to the PV panel supporting bed through the at least one PV panel.

In some implementations according to this third aspect of the invention, the PV panel is integrated with materials to form a paver such as a paver according to the first aspect of the invention. In these implementations the PV panel is set in the PV panel supporting bed through the integrated paver material such as the frame and molded base material described above. In other implementations according to this third aspect of the invention, the PV panel is a separate component preferably in a suitable frame, which is set directly in or on the layer of granular material, and light-transmissive pavers such as that described above in connection with the second aspect of the invention are placed on the upwardly facing panel first surface.

Regardless of which type of PV panel is used in such an installation, the moisture introduction arrangement allows water to be released into the porous and permeable layer formed by the granular material making up the PV panel supporting layer. This introduced water and the evaporation of the water serves to moderate the temperature of the PV panel supporting bed and thereby moderate the temperature the PV panel in the installation. This moderation of temperature allows the PV panel to operate more efficiently and compensates for any loss of efficiency cause by the reduction of light incident on the panel through the pavers. In particular, the moderation of temperature helps compensate for the reduction of light reaching the PV panel occasioned by any reduced light transmissivity layer in the paver or pavers.

In installations according to this third aspect of the invention the moisture introduction arrangement may include at least one conduit extending through the volume defined by the PV panel supporting bed. The conduit incorporates suitable emitters or is formed at least partially from a water-permeable material to facilitate the communication of water from the conduit to the porous and permeable layer comprising the PV panel supporting bed.

A fourth aspect of the invention encompasses a PV panel installation similar to the above-described installation in which the PV panel is a separate component and the light-transmissive pavers are placed on the PV panel. However, an installation according to this fourth aspect of the invention does not include any moisture introduction arrangement. Rather implementations according to this aspect of the invention rely on the natural moderation of temperature provided by the subgrade to moderate the temperature of the PV panel or panels included in the installation.

An installation as described above and in further detail below in connection with the drawings, functions to provide a PV panel array that may be identical or very similar in appearance to that of a conventional landscape paver patio, walkway or drive located in a property landscape while simultaneously providing solar generated electricity. The sun energy moves through the atmosphere and strikes the top surface of the light transmissive landscape pavers and travels through the light-transmissive paver materials and then into the PV panel where the electricity is generated. Where included in the installation, the moisture introduction arrangement (which may comprise low volume drip irrigation lines) provides cooling to the PV panels including any associated electronics, such as batteries and micro-inverters, through the heat absorbing capacity of the water and through the cooling occasioned by evaporation of the introduced water. The light-transmissive landscape pavers can be installed in a configuration to form areas of a patio, walkway, or drive of uniform appearance which blends in well or is even indistinguishable from adjacent areas formed from traditional, non-PV generation enabling, paver materials.

The PV panel installation according to the various aspects and feature of the invention has the following advantages:
 (1) No rooftop installation is required, thus avoiding drawbacks and dangers of rooftop installation as described above, such as roof modification and the unsightly appearance of the PV panel array on the roof.
 (2) No conventional ground mount is required which takes up ground space and is unsightly.
 (3) The installed PV panel array is also a functional and aesthetically pleasing ground surface amenity such as a patio, walkway, or drive.
 (4) The diurnal temperature swings of installations according to the invention may be typically on the order of ten degrees Fahrenheit where the ambient temperature swing might be thirty-five degrees Fahrenheit and the rooftop temperature swings might be one hundred degrees Fahrenheit. The lower temperature swing reduces stresses on the PV panels and associated electronic components.
 (5) The PV panel electrical generation performance is better that prior art installations due to the cooler operating temperatures.
 (6) Installation labor and maintenance is lower in cost and safer due to the on-ground location as opposed to the elevated roof or elevated ground mount locations.

These and other aspects of the invention and advantages and features of the invention will be apparent from the following description of representative embodiments, considered along with the accompanying drawings.

DESCRIPTION OF REPRESENTATIVE EMBODIMENTS

Figure 10:
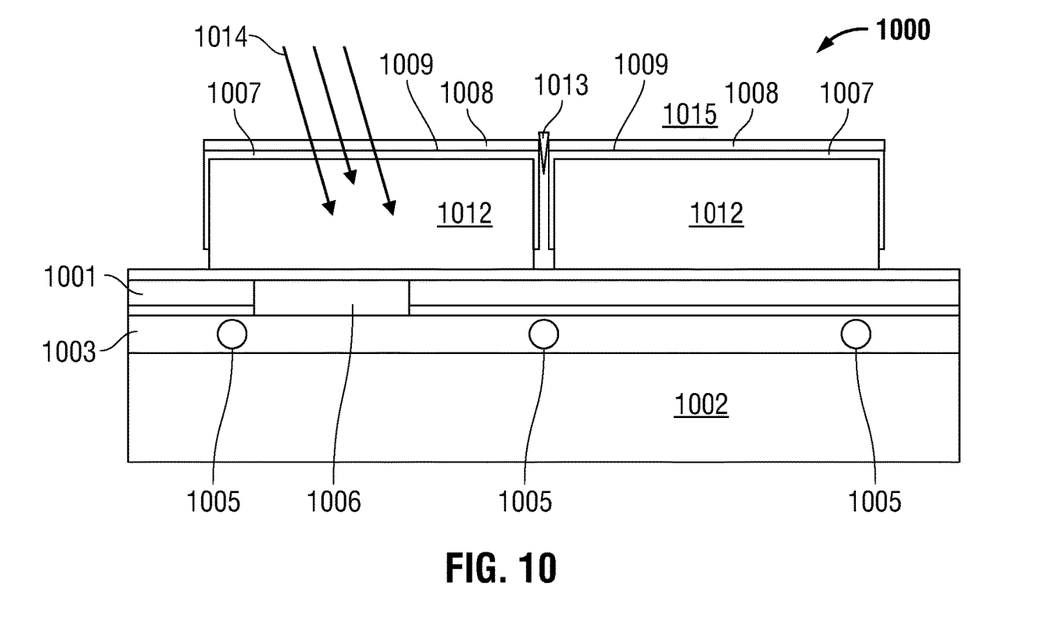
FIG. 10 is a schematic section representation of a PV panel installation according one implementation of the present invention.
Figure 11:
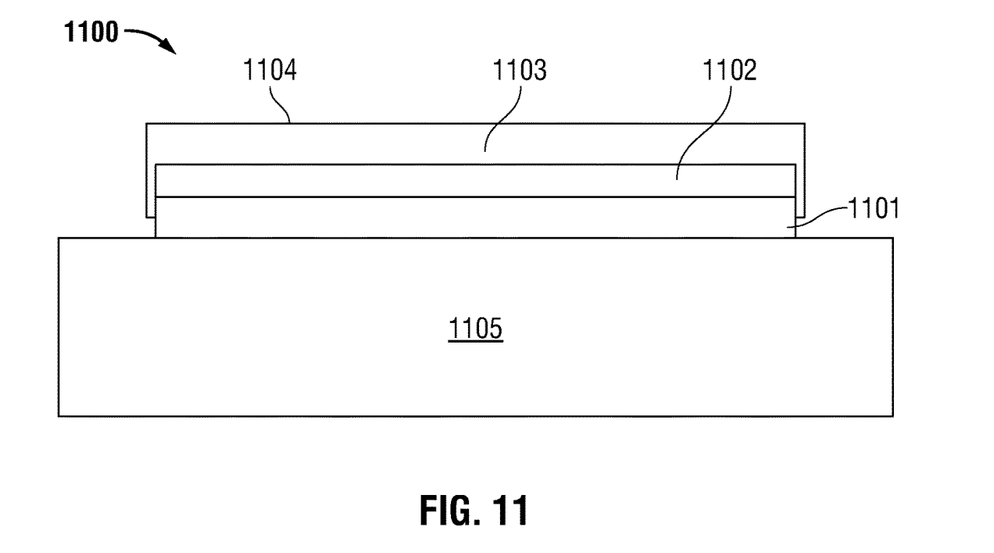
FIG. 11 is a schematic section representation of a PV panel installation according another implementation of the present invention.

In the following description, FIGS. 1-4 will be referenced below to describe pavers which include an integrated PV panel and installations using such composite pavers. FIGS. 5-9 will be referenced below to describe installations in which a PV panel is set separately from pavers to form a hardscape capable of PV power generation, and pavers which may be used in such installations. FIG. 10 will be referenced to describe another example PV panel installation in accordance with aspects of the invention in which the PV panels are set in place in the installation separately from the landscape pavers and other installation components. FIG. 11 will be referenced to describe another example PV panel installation in accordance with aspects of the invention in which a PV panel is integrated with a paver and set in place in the installation by setting the paver.

Figure 1:
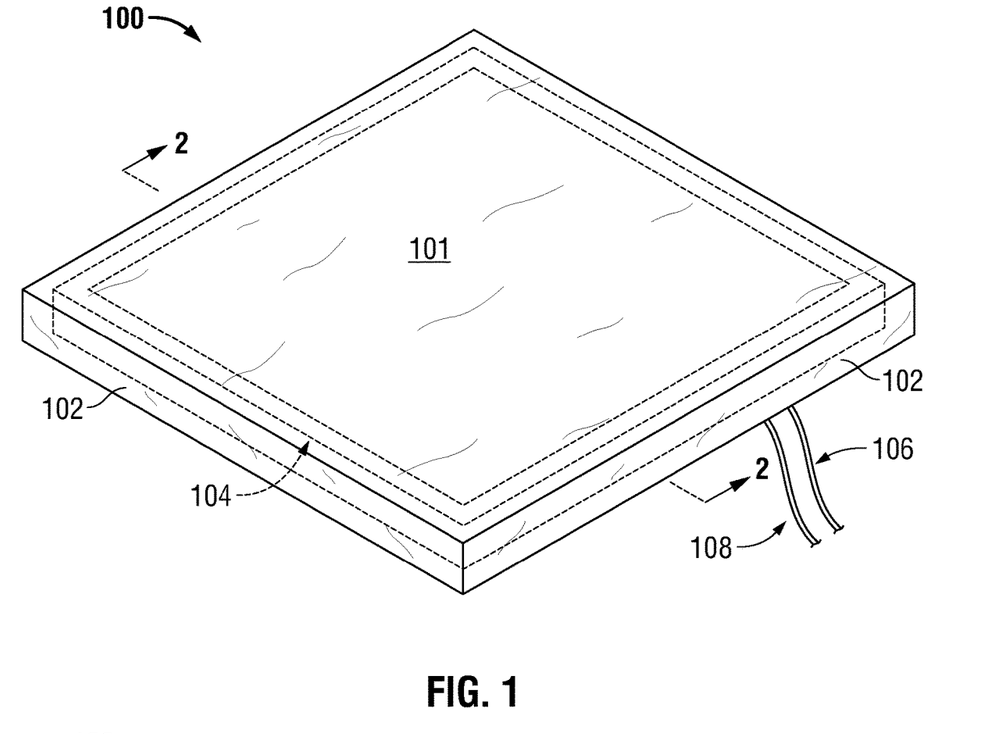
FIG. 1 is a perspective view of a landscape paver embodying principles of the invention.

FIG. 1 shows a perspective view of a composite landscape paver 100 in accordance with aspects of the present invention in which a PV panel is incorporated into the paver structure. As indicated in the figure, it is not apparent at least from the illustrated perspective that paver 100 incorporates a PV panel. The outward appearance from this perspective provides the appearance of a traditional square paver with a top surface 101 (representing a load receiving surface for the paver) and in the case of this square example, four side surfaces 102 including the two such surfaces visible from this perspective. The hidden lines shown in FIG. 1 show the outline of a rigid frame 104 which is included in composite paver 100. Rigid frame 104 is associated with a PV panel included in paver 100 and shown and described in connection with the section view of FIG. 2. However, depending upon the particular construction of the paver using low-light-transmissivity granular material in the construction of paver 100 as discussed in detail below, the rigid frame 104 and the PV panel may not be discernable as such from the perspective shown in FIG. 1. In this example, the only indication that paver 100 incorporates a PV panel is the arrangement of two pairs of leads 106 and 108 protruding from a bottom surface of the paver not visible in this perspective.

It should be appreciated that the square shape of paver 100 is simply provided as an example and that pavers according to the present invention may be formed in any desired shape. Pavers according to the invention may provide a top surface in the shape of an elongated rectangle or other polygonal shape, or a circle, oval, or other non-polygonal shape. Also, although FIG. 1 shows that the top surface 101 and side surfaces 102 of paver 100 includes slight undulations or contours across the surfaces, each surface remains substantially planar. Various features or roughness may be molded or otherwise provided in particularly top surface 101 to provide a generally planar, nonslip surface appropriate for use as a walking surface. Also, pavers embodying principles of the invention such as example paver 100 and the other example pavers described herein may have any suitable dimensions, including common traditional paver dimensions. For example, paver 100 may be approximately 24 inches by 24 inches and approximately 2 inches thick.

Figure 2:
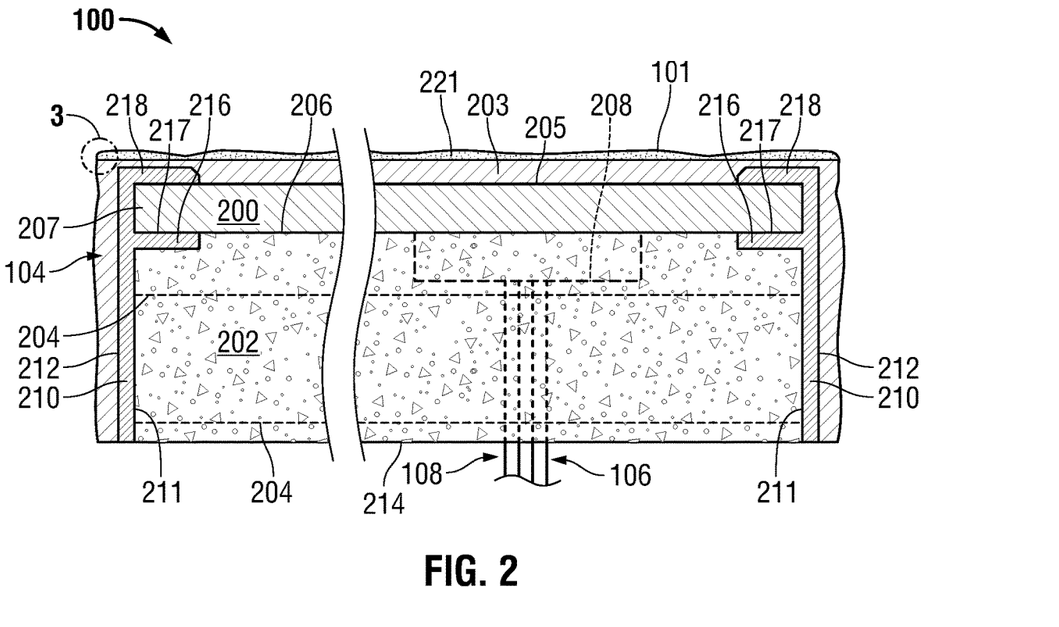
FIG. 2 is a view in section taken along line 2-2 in FIG. 1.

The section view of FIG. 2 shows that the PV panel shown generally at 200 and frame 104 are included in paver 100 between a molded base material 202 and a paver cover material 203. PV panel 200 has a panel first surface 205 and a panel second surface 206. These two surfaces 205 and 206 are bounded by a peripheral edge 207. In this example implementation, peripheral edge 207 of PV panel 200 forms generally a square shape in top plan view to maximize the surface area of panel first surface 205 in paver 100. Operating light incident on panel first surface 205 produces a photovoltaic effect so that PV panel 200 is operable to provide electrical power at a panel output terminal, defined in this case by either of the two pairs of leads 106 and 108 shown in both FIGS. 1 and 2. The example PV panel 200 includes a junction box 208 located on the panel second surface 206. Junction box 208 may include electronic components associated with panel 200 and terminals for the positive and negative wires of leads 106 and the positive and negative wires of leads 108. It will be appreciated that PV panels such as panel 200 may, depending upon the PV technology employed, be formed from multiple layers of semiconductor materials together with other structures such as conductor traces, all encapsulated between one or more layers of backing material and one or more layers of glass or other transparent cover material. Since the present invention encompasses any PV technology for producing a PV panel, and since in any event the internal structure of the PV panel is not relevant to an understanding of the present invention, each PV panel shown in section in the drawings is shown without any internal detail.

FIG. 2 shows that rigid frame 104 in the example embodiment of FIGS. 1 and 2 includes a frame member 210 that extends in a height dimension perpendicular to a plane defined by panel first surface 205. In this example, and as is apparent from the hidden lines shown in FIG. 1, frame member 210 extends along the entire panel peripheral edge 207. A frame inside surface 211 together with the panel second surface 206 defines a base volume while a frame outside surface 212 faces away from the base volume. The molded base material 202 is located in the base volume and in this example fills the entire base volume so as to define most of a bottom surface 214 of paver 100. In particular, molded base material 202 includes a base material backing surface which is molded against at least a portion of panel second surface 206 and a lateral surface which is molded against at least a portion of the frame inside surface 211. The example of FIG. 2 shows two different spaced apart layers of reinforcing material 204 include in the molded base material 202 to improve the strength characteristics of paver 100, and particularly, improve resistance to bending from a plane parallel to the plane of panel first surface 205.

Paver cover material 203 extends over the panel first surface 205 and preferably, but not necessarily, over at least a portion of the frame outside surface 212. In this example, paver cover material 203 extends over substantially all of the frame outside surface 212 to define all of the sides 102 of paver 100. Paver cover material 203 is comprised of a light transmissive material at least in portions extending over one or more areas of panel first surface 205 and preferably over the entire panel first surface. As will be discussed below, paver cover material 203 may include a material which is molded over the PV panel and frame to define a lower cover material surface molded against the panel first surface and a cover material inside lateral surface molded against the frame outside surface.

In the example of FIG. 2 frame 104 includes a panel support flange 216 extending from frame inside surface 211. This panel support flange 216 defines a peripheral sealing surface 217 abutting a portion of panel second surface 206 in this case. This example frame 104 further includes a panel capture flange 218 which together with panel support flange 216 defines a panel receiving channel which captures peripheral edge 207 of PV panel 200 around the entire peripheral edge. In the example of FIG. 2 at least a portion of frame 104 is exposed on bottom surface 214 of landscape paver 100. Where the frame comprises an electrically conductive material such as aluminum, this exposed portion of frame 104 provides a ground point for the PV panel when the paver is placed in an installed position as will be described further below in connection with FIG. 5. Alternatively, the entire frame 104 may be completely encapsulated within base material 202 and cover material 203 so that the frame is isolated from the environment.

In order to produce an appearance approximating a traditional landscape paver, paver 100 includes a reduced light transmissivity layer 221 shown in FIG. 2 as a thin layer of material which includes the paver top surface 101. This reduced light transmissivity layer 221 includes a light transmissive material 301 in which is embedded or otherwise included low-light-transmissivity granular material 302 as shown in the enlarged view of FIG. 3. The low-light-transmissivity granular material may comprise grains of sand, quartz, plastics, combinations of these materials, and or other suitable low-light-transmissivity granular materials to produce the desired appearance. While the grains 302 of low-light-transmissivity granular material will block some of the incident light from passing through from paver top surface 101 to panel first surface 205, the granular material is preferably included in such a concentration so as to reduce the overall light transmissivity of the reduced light transmissivity layer by no more than approximately 10%, that is, 10% as compared to the light transmissive material 301 in layer 221 if the material included no such granular material. The low-light-transmissivity granular material positioned over one or more areas of the reduced light transmissivity layer 221 may be made up of grains having a maximum dimension between approximate 10 microns and approximately 7500 microns, and preferably between approximately 2000 microns and approximately 3000 microns.

Figure 4:
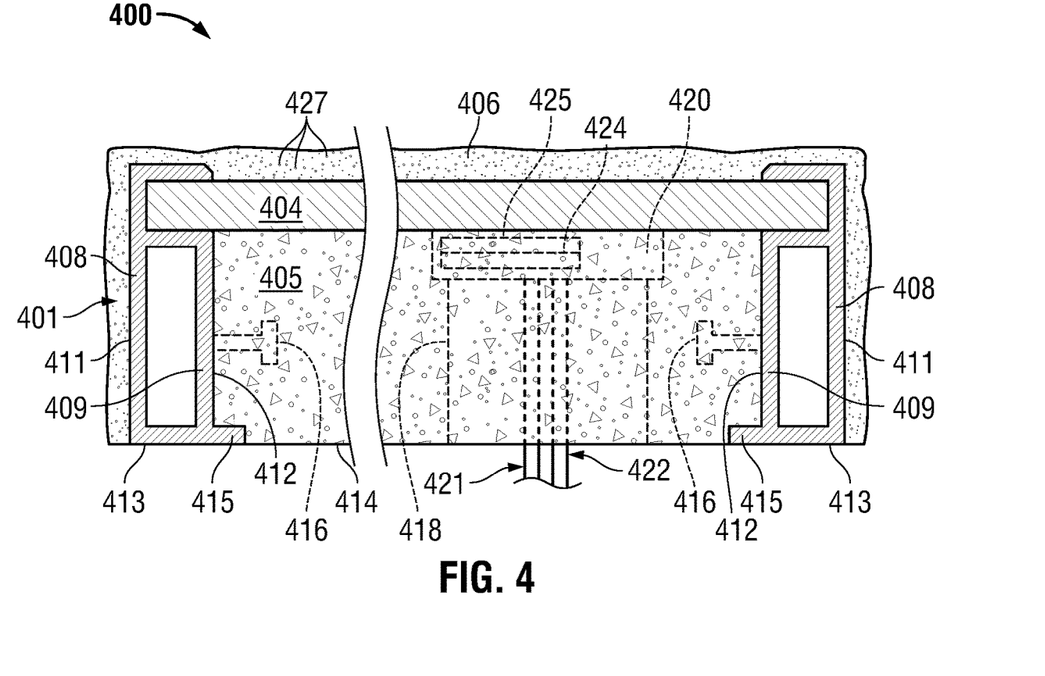
FIG. 4 is a view in section similar to FIG. 2, but showing a landscape paver having an alternate frame structure.

FIG. 4 shows an alternative paver construction in a paver 400 including a rigid frame 401 having a different configuration as compared to frame 104 shown in FIG. 2. This alternate embodiment includes a PV panel 404, molded base material 405, and cover material 406 similar to the embodiment shown in FIG. 2. However, frame 401 includes tube structure including an outside member 408 and an inside member 409. Outside member 408 in this embodiment forms the frame outside surface 411 facing cover material 406, while inside member 409 forms the frame inside surface 412. Frame 401 also includes a base member 413 which is exposed at the paver bottom side 414. Base member 413 also includes a lip 415 which projects from inside surface 412. The example frame 401 shown in FIG. 4 also includes studs 416 which may be spaced apart along the frame inside surface 412 along the length of the frame to further strengthen the composite structure.

The alternative paver construction shown in FIG. 4 also includes an access opening 418 formed in the molded base material 405 to provide access to panel junction box 420. In this alternate construction, lead pairs 421 and 422 extend through the access opening rather than being embedded in the molded base material as shown in the example of FIG. 2.

The example of FIG. 4 also shows a GPS electronic module 424 operatively connected to a battery 425 for supplying power to the GPS electronic module. In this example GPS electronic module 424 and battery 425 are contained in PV panel junction box 420 although it will be appreciated that these elements may be located in a separate junction box or placed in another location within the paver structure. A small portion of the PV panel output in this arrangement may be used to charge battery 425. Suitable electronic components for providing the desired charging may be housed within junction box 420 or elsewhere in the paver. GPS electronic module 424 may be in wired or wireless communication with appropriate receiving hardware located in paver 400 or remotely to provide spatial location of the module and therefore the composite paver 400 in which it is located. In addition to providing spatial location information, GPS electronic module 424, or a separate electronic module located in junction box 420 or elsewhere in the structure of paver 400, may include electronic components for monitoring and collecting performance data for the paver such as power output, paver temperature, and cumulative power output, for example. This performance data for paver 400 may be communicated from GPS electronic module 424 or other module to monitoring and reporting components for the PV panel system in which paver 400 is included.

The alternate paver construction shown in FIG. 4 also includes a different configuration for the reduced light transmissivity layer as compare to that shown in FIG. 2. In the example of FIG. 4, all of cover material 406 makes up the reduced light transmissivity layer including low-light-transmissivity granular material 427. However, it should be appreciated that implementations according to the present invention are not limited to the two arrangements for the reduced light transmissivity layer shown in FIGS. 2 and 4. For example, another arrangement within the scope of the present invention includes a distinct reduced light transmissivity layer spaced apart from both the paver top surface and from the surface of the cover material facing the PV panel. Additionally, there may be multiple reduced light transmissivity layers in the cover material over the PV panel. More generally, the reduced light transmissivity layer or layers may be formed at any location of the cover material and in any fashion to incorporate the low-light-transmissivity granular material. In any of these arrangements, the granules of low-light-transmissivity material in one or more layers above the PV panel first surface together with coloration of the PV panel first surface (and the coloration of any upwardly facing frame surfaces) allows the landscape paver to match or at least approximate the appearance of a traditional paver appropriate for walkways, patios, and other hardscapes.

Numerous types of materials may be used for forming the frame, such as frames 104 and 401, shown in FIGS. 2 and 4, respectively. For example, the rigid frame may be formed from aluminum or other suitable metals. These frames may also be formed from plastics. Also, because the frame may be completely encapsulated and protected within the paver cover material, the frame may be formed from fiber board and similar materials.

Base material such as that shown at 202 and 405 in FIGS. 2 and 4, respectively, may comprise concrete or any other suitable material which may be molded within the paver frame. Where concrete is used it may include lightening materials and additives to provide the desired strength and weight characteristics for the completed paver.

The cover material which may be used in a composite paver according to the present invention may comprise a suitable clear polymer resin, epoxy, pourable clear plastic polymer, or any clear, moldable material which provides the desired light transmissivity when the material is cured or hardened.

It should also be appreciated that any of the features shown in the two example configurations of FIGS. 2 and 4 may be used in other configurations within the scope of the present invention. For example, although reinforcing material 204 is shown only in the embodiment of FIG. 2, such material may also be included in any other embodiment including the embodiment of FIG. 4. Likewise, the studs 416 shown in the example of FIG. 4, may be included in any other embodiment, including the embodiment of FIG. 2.

The composite paver structure shown for example in FIGS. 2 and 4 may be formed in any suitable process. One preferred fabrication process includes first forming the PV panel and frame arrangement, and supporting this arrangement inverted from the position shown in the figures so that the frame inside surface (211 in FIG. 2) and panel second surface (206 in FIG. 2) form an upwardly facing receptacle for receiving base material in liquid or flowable form. Since the base material may be fairly heavy, good support may be needed for the PV panel to prevent bending in the PV panel under the load of the base material before it solidifies. Also, forms may be required to provide any desired features in the base material, such as the access opening 418 shown in FIG. 4.

Once the base material is placed in the above-noted upwardly opening receptacle formed by the frame and PV panel, and solidifies appropriately, the resulting intermediate structure of PV panel, frame, and base material may be placed in a suitable mold which allows the cover material to be molded on to the structure. For example, the intermediate structure may be placed PV panel side down into a mold which leaves a gap into which the cover material may be poured, injected, or otherwise placed. It is also possible to partially prefill the mold and press the intermediate structure into the partially filled mold to form the desired cover layer. Once the cover material has hardened sufficiently, the resulting structure may be removed from the mold for any further processing or assembly.

Figure 3:
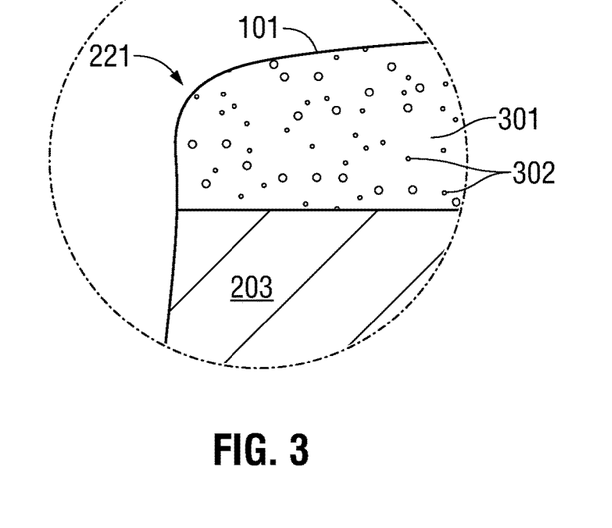
FIG. 3 is an enlarged view of a portion of the paver cover material showing a reduced light transmissivity layer.

Any low-light-transmissivity granular material desired for a give implementation may be introduced into the structure in a number of ways within the scope of the present invention. For example, the granular material may be spread out across the bottom of the mold used to mold the cover material onto the intermediate structure. This process produces a reduced light transmissivity layer generally as shown in the example of FIGS. 2 and 3. Alternatively, the low-light-transmissivity granular material may be mixed uniformly with the cover material prior to being molded on to the intermediate structure to produce a reduced light transmissivity layer as shown in the example of FIG. 4. In yet other techniques, the cover material may be molded on in multiple layers, any one or more of which may contain the low-light-transmissivity granular material.

Figure 5:
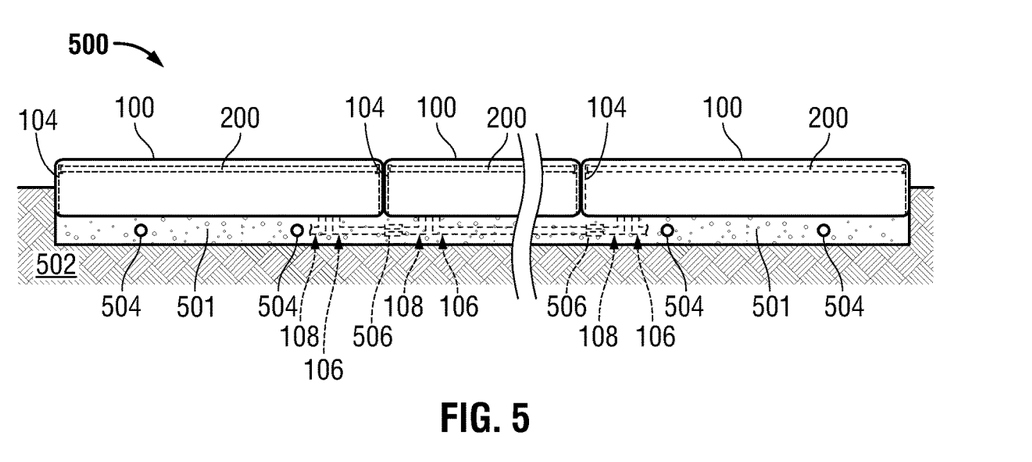
FIG. 5 is an elevation view along a vertical plane through a PV panel installation embodying principles of the invention, the PV panel installation employing landscape pavers as shown in FIGS. 1 and 2.

The view of FIG. 5 may be used to described a landscape paver installation employing PV panel integrated pavers such as those shown in FIGS. 1-4. Installation 500 includes a PV panel supporting bed 501 formed on a subgrade 502. PV panel supporting bed 501 includes a layer of granular material above subgrade 502, preferably a granular material such as paver sand. A moisture introduction arrangement is in fluid communication with PV panel supporting bed 501. In this case the moisture introduction arrangement includes at least one conduit 504 extending through the volume defined by PV panel supporting bed 501. Conduit 504 may include periodic emitters or may be formed in part or in sections of a permeable material to allow water directed through the conduits 504 to escape into the granular material comprising PV panel supporting bed 501.

The example of FIG. 5 shows multiple pavers 100 set in PV panel supporting bed 501 so as to be supported by the bed of granular material. The PV panels 200 integrated in pavers 100 are shown connected in series by lead pairs 106 and 107. Each of these connections may be formed from a suitable waterproof connector 506 such as an MC-4 connector for example. Although not shown FIG. 5, it will be appreciated that these lead pairs 106 and 107 are connected to the leads of other such pavers to form an array of series connected panels which is ultimately connected by suitable means to further equipment associated with the array. In particular, panels such as panels 200 shown FIG. 5 may be connected in series to an inverter as is known in the field of PV panel arrays. However, the present invention is not limited to any particular arrangement for connecting the various PV panels of an array of pavers. For example, PV panels according to the invention may be connected in parallel with each other rather than in series. Also, any additional electrical equipment may be included in an installation such as installation 500 to enhance the performance or otherwise affect the performance of the PV panel array including optimizers and other circuitry that may be associated with each panel or groups of panels in the installation.

Regardless of how the PV panels in the composite pavers are connected to equipment for extracting power from the array, the paver provides cover material 203 as a light transmissive layer above each panel so that light, especially sunlight, incident on the paver may pass through to the PV panel. The light transmissive layer also serves to protect the relatively fragile PV panel surfaces from contact and also serve as a carrier for the granular material described above which provides the desired appearance for the pavers. Meanwhile, the molded base material 202 in each paver 100 supports the respective PV panel 200 to prevent any bending forces in the panel which might damage the panel structure. Base material 202 also functions to transfer any forces applied to the light transmissive load bearing surface 101 of the paver to the material making up the PV panel supporting bed 501 below. Water may be introduced into the granular material making up the PV panel supporting bed 501, and this introduced water together with the evaporation of that water helps moderate the temperature of pavers 100 and PV panels 200 incorporated in the pavers. Aside from the water which may be introduced into PV panel supporting bed 501, the thermal mass of the bed 501 and subgrade 502 in which it is formed also helps moderate temperature swings in PV panels 200 due to incident sunlight and atmospheric conditions.

Figure 6:
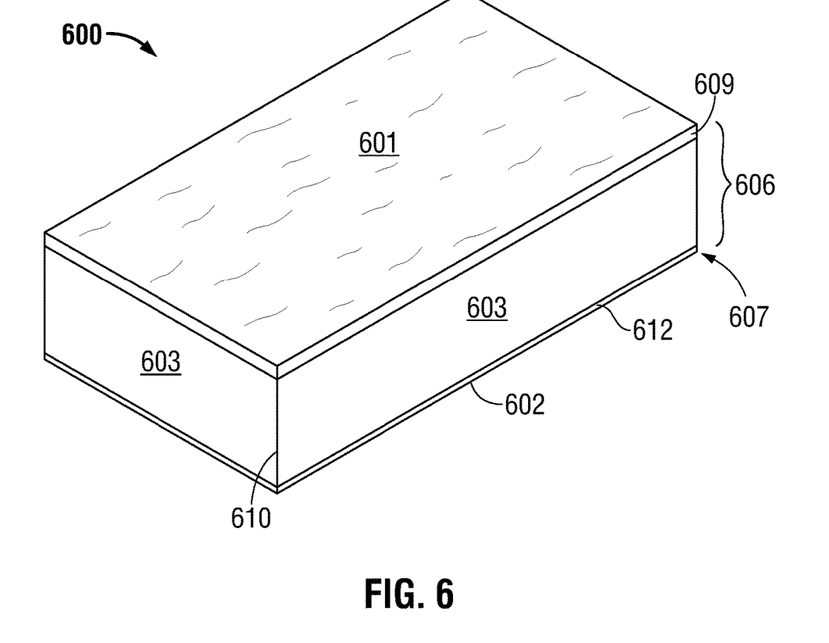
FIG. 6 is a perspective view of an alternate landscape paver embodying principles of the invention.

FIG. 6 shows an alternative landscape paver 600 which may be used in installations in accordance with aspects of the present invention in which the PV panel is not incorporated in the pavers, but is installed separately from the pavers. Paver 600 includes a paver load receiving surface or top surface 601, a paver bottom surface (the edge of which is indicated at 602), and a paver lateral surface 603. In this case the paver lateral surface 603 comprises the four lateral sides of the rectangular box shape formed by the paver. The paver body defined between the paver load receiving surface 601, paver bottom surface 602, and paver lateral surface 603 is light transmissive so that at least some light incident on the paver load receiving surface 601 may travel through the paver body and escape from the paver body through paver bottom surface 602. Paver 600 also includes at least one reduced light transmissivity layer extending transverse to a direction from paver load receiving surface 601 to paver bottom surface 602. The reduced light transmissivity layer in paver 600 includes a light transmissive material in which is included low-light-transmissivity granular material as described above in connection with FIGS. 2 and 4.

In the example paver 600 shown in FIG. 6, the paver body includes an upper assembly 606 and a lower assembly 607. Upper assembly 606 in this example is made up of a single layer 609 comprising the reduced light transmissivity layer of the paver, and a main layer 610 of light transmissive material. Lower assembly 607 in paver 600 includes a layer 612 of light transmissive elastomer material. As will be described below in connection with an installation in which paver 600 is used, this light transmissive elastomer is placed facing and perhaps directly in contact with the upwardly facing surface of the PV panel.

While example paver 600 includes three layers of material, layers 609, 610, and 612, it will be appreciated that a light transmissive paver in accordance with the aspects of the invention may include more than three layers. Also, it is possible that a bottom elastomer layer may be omitted from the paver and instead applied in an installation as a separate layer of material. In this case a light transmissive paver may include only the reduced light transmissivity layer and one additional layer, or even a single layer of material incorporating low-light-transmissivity granular material. The various layers of material included in the upper assembly 606 of paver 600 may include any of the light transmissive materials described above in connection with the composite pavers shown in FIGS. 2 and 4. The low-light-transmissivity granular material may also comprise any of the materials described above in connection with the composite pavers.

Figure 7:
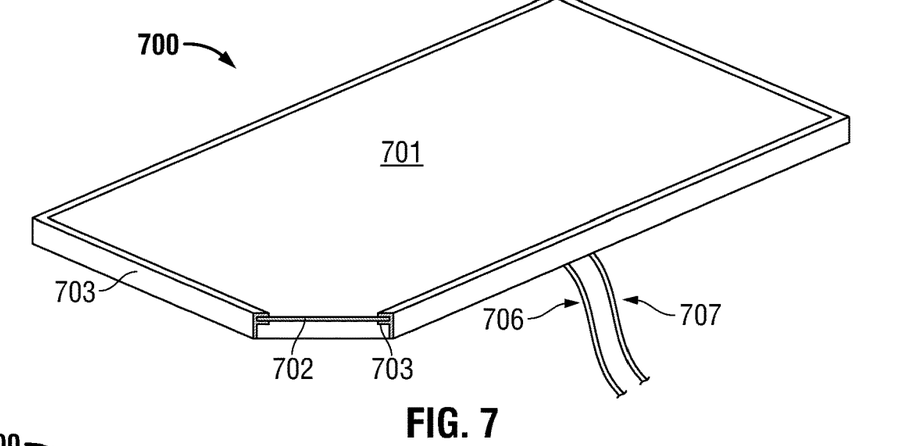
FIG. 7 is a partially broken-away perspective view of a framed PV panel which may be used in a PV panel installation in accordance with aspects of the invention.

FIG. 7 shows an example of a PV panel structure which may be used together with light transmissive pavers such as paver 600 to produce a PV panel installation in accordance with aspects of the present invention. The illustrated PV panel structure includes a PV panel 700 having a panel first surface 701 to which light may be directed to produce the desired photovoltaic effect. PV panel 700 in this example is mounted in a rigid frame 703 which extends around the entire peripheral edge of PV panel 700. Frame 703 may have a channel structure similar to that shown in FIGS. 2 and 4 for capturing the peripheral edge of PV panel 700. Frame 703 also includes a frame member which may be similar to frame member 210 shown in FIG. 2 or a tube structure having frame members similar to frame members 408 and 409 shown in FIG. 4.

Figure 8:
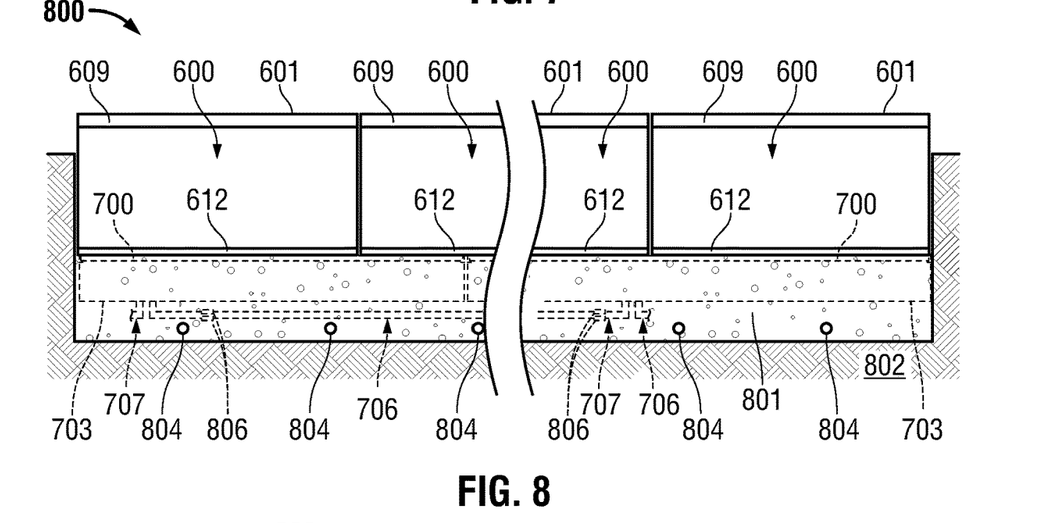
FIG. 8 is an elevation view along a vertical plane through a PV panel installation embodying principles of the invention, the PV panel installation employing landscape pavers as shown in FIG. 6 and framed PV panels as shown in FIG. 7.

FIG. 8 shows a PV panel installation 800 employing pavers 600 shown in FIG. 6 and the PV panel structure shown in FIG. 7. Installation 800 includes a PV panel supporting bed 801 of granular material formed on a subgrade 802 similar to the PV panel supporting bed 501 shown in the installation of FIG. 5. However, in installation 800 each PV panel structure including PV panel 700 and frame 703 is set directly in the PV panel supporting bed 801. That is, PV panels 700 are positioned on panel supporting bed 801 with panel first surface 701 facing upwardly and the panel second surface 702 (shown in FIG. 7) facing the granular material forming the PV panel supporting bed. Since this example includes frame 703 with each PV panel 700, the frame protrudes into the material of PV panel supporting bed 801 in position to stabilize the PV panel from lateral movement. PV panels 700 in this installation are connected in series via connectors 806 similarly to the arrangement shown in FIG. 5, although alternative installations may connect the panels differently as described above in connection with the installation shown in FIG. 5 together with additional circuitry known in the field of PV power generation.

The light transmissive paver 600 in this installation is placed with the bottom surface 602 formed by elastomer material 612 facing the upwardly facing panel first surface 701 while the panel second surface 702 is supported by the granular material making up the PV panel supporting bed 801. This support from PV panel supporting bed 801 below prevents the relatively fragile PV panel 700 from bending significantly under loads which may be placed on the top surface of the installation comprising the load receiving surfaces 601 of pavers 600.

The example installation 800 of FIG. 8 includes conduits 804 similar to those described above in connection with the insulation shown in FIG. 6. However other implementations including separately installed pavers and PV panels may omit the conduits and rely on the temperature moderating effect of subgrade 802 and PV panel supporting bed 801 to moderate the temperatures of the PV panels and thus improve the performance and reliability of the panels.

Figure 9:
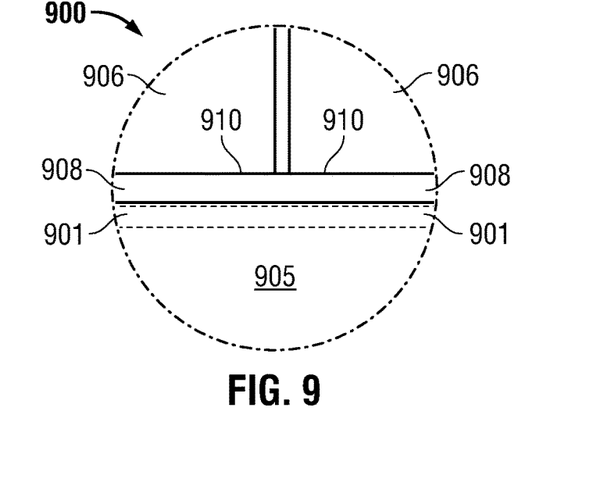
FIG. 9 is an enlarged view of a small portion of a PV panel installation similar to that shown in FIG. 8, but showing an alternate elastomer arrangement between the pavers and PV panel.

FIG. 9 shows a small portion of another installation 900 similar to that shown in FIG. 8. The view of FIG. 9 shows that installation 900 includes a framed PV panel 901 similar panel 700 and frame 703 in FIG. 8, supported on a PV panel support bed 905 corresponding to bed 801 in FIG. 8. Installation 900 further includes light transmissive pavers 906 above PV panel 901. However, installation 900 shown in FIG. 9 relies on a separate sheet 908 of light transmissive elastomer between the upwardly facing surface of PV panel 901 and the bottom surface 910 of the light transmissive pavers 906 placed over the PV panels in the installation. This is in contrast to the arrangement shown in FIG. 8 using pavers such as those shown in FIG. 6 which incorporate an elastomer layer as the bottom layer of the paver itself. Yet other implementations may include both an elastomer layer at the bottom of the pavers as in FIGS. 6 and 8, and a separate sheet of elastomer material such as sheet 908 in FIG. 9 that extends over the upwardly facing first panel surface in position to receive the light transmissive pavers.

The PV panel installation shown schematically in FIG. 10 includes two light-transmissive landscape pavers 1000 located on top of a PV panel 1001. PV panel 1001 is positioned in landscape ground 1002 set on top of a PV panel supporting bed comprising a bed of sand 1003. An optional layer of landscape fabric 1004 is located between the PV panel lower surface and the upper surface of sand bed 1003. Sand bed 1003 may contain a series of low volume drip lines 1005 similar to drip irrigation lines to emit water to sand bed 1003 in a controlled manner for cooling of PV panel 1001, and any associated electronics, such as batteries or micro-inverters 1006.

Light transmissive landscape pavers 1000 in this example embodiment include a glass container 1007 with an optical, highly light-transmissive coating 1008 on the upper surface, contained within or below the glass container 1007 upper surface 1009. Within glass container 1007 is a water clear to clear polyurethane rubber 1012 which substantially fills the glass container and extends down to the upper surface of PV panel 1001. There may be a grout fill material 1013 which is in between adjacent light-transmissive landscape pavers 1000. Sun rays 1014 pass through the atmosphere 1015 above pavers 1000, through the light transmissive landscape pavers 1000, and strike the PV panel 1001, allowing solar electric energy to be produced from an aesthetically pleasing landscape paver installation such as a walkway or patio.

The installations according to the preferred embodiment locate conventional PV panels just below the ground, preferably in a sand base such that the sand material butts up to the bottom side surface of the PV panel back sheet or back glass, providing compressive support to the PV panel. The PV panels in the array may be connected together in a typical fashion of any convention multi-panel solar array. All of the necessary electrical connections can be implanted in the sand base beneath the solar modules and waterproofed with conventionally available waterproof connectors. If desired, a water permeable landscape fabric can be installed between the sand layer and the solar panel modules. Additional cooling of the panels can be attained by intermittently running low volume irrigation drip lines installed within the sand base to keep the sand base moist and provide cooling through the latent heat of evaporation as water evaporates from the sand base.

Once the base of sand, optional landscape fabric and irrigation drip tubing is established and the PV panels are laid on top and connected up, the light-transmissive landscape pavers can be laid down over the modules to form the upper patio, walkway or drive surface. The light permeable landscape pavers can be laid in any pattern and extend out past the area of the solar panel modules to create a landscape feature independent of the geometry of the solar array beneath it. In areas of landscape feature where there are no solar modules below the light permeable landscape pavers can be directly laid on a sand base with water permeable landscape fabric on it.

The light permeable landscape pavers can be designed and fit tightly so that no filling grout material is needed between the pavers or they can have an appropriate grout material filled in between the pavers.

The schematic representation of FIG. 11 shows a composite light-transmissive paver 1100 with integrally molded concrete back 1101, a PV panel 1102, and a clear resin or polymer cover material 1103 providing a top surface 1104 for the paver. Composite paver 1100 is placed on sand or the ground surface 1105 such that it can function as a landscape paver paved patio, walkway or path and an element of a functioning PV panel array.

The integrally molded composite light-transmissive landscape paver may be installed by placing the unit over a sand base like a conventional paver, connecting the leads from the PV panels embedded in the composite light-transmissive landscape pavers, and routing the connections to a string inverter and/or appropriate electrical or panel connections. The electrical inverter could also be located on the back of the PV module and embedded in the concrete on the backside of the composite unit paver.

As used herein, whether in the above description or the following claims, the terms "comprising," "including," "carrying," "having," "containing," "involving," and the like are to be understood to be open-ended, that is, to mean including but not limited to. Also, it should be understood that the terms "about," "substantially," and like terms used herein when referring to a dimension or characteristic of a component indicate that the described dimension/characteristic is not a strict boundary or parameter and does not exclude variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary the least significant digit.

Any use of ordinal terms such as "first," "second," "third," etc., in the following claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The term "each" may be used in the following claims for convenience in describing characteristics or features of multiple elements, and any such use of the term "each" is in the inclusive sense unless specifically stated otherwise. For example, if a claim defines two or more elements as "each" having a characteristic or feature, the use of the term "each" is not intended to exclude from the claim scope a situation having a third one of the elements which does not have the defined characteristic or feature.

The above described preferred embodiments are intended to illustrate the principles of the invention, but not to limit the scope of the invention. Various other embodiments and modifications to these preferred embodiments may be made by those skilled in the art without departing from the scope of the present invention. For example, in some instances, one or more features disclosed in connection with one embodiment can be used alone or in combination with one or more features of one or more other embodiments. More generally, the various features described herein may be used in any working combination.

The invention claimed is:

1. A landscape paver including:
   (a) a PV panel having a panel first surface and a panel second surface with the panel first surface and the panel second surface bounded by a panel peripheral edge, the PV panel being operable to provide electrical power in response to operating light incident on the panel first surface;
   (b) a rigid frame extending along the panel peripheral edge and having a frame inside surface and a frame outside surface, the frame inside surface together with the panel second surface defining a base volume and the frame outside surface facing away from the base volume;
   (c) a molded base material located in the base volume, the molded base material including a base material backing surface and a base material lateral surface, the base material backing surface being molded against at least a portion of the panel second surface so that at least a portion of the base material backing surface is shaped by contact with the panel second surface and the base material lateral surface being molded against at least a portion of the frame inside surface so that at least a portion of the base material lateral surface is shaped by contact with the frame inside surface; and
   (d) a paver cover material extending over the panel first surface, the paver cover material being light-transmissive at least in portions extending over one or more areas of the panel first surface.

2. The landscape paver of claim 1 wherein the rigid frame includes a panel support flange extending from the frame inside surface and defining a peripheral sealing surface abutting a portion of one of the panel first surface and panel second surface.

3. The landscape paver of claim 2 wherein at least a portion of the rigid frame is exposed on a bottom surface of the landscape paver.

4. The landscape paver of claim 2 wherein the rigid frame includes a panel receiving channel defined between the panel support flange and a panel capture flange surface.

5. The landscape paver of claim 1 further including reinforcing elements embedded in the molded base material and extending substantially parallel to a plane of the PV panel.

6. The landscape paver of claim 1 wherein the paver cover material is a layer of molded material defining a lower cover material surface molded against the panel first surface and defining a cover material inside lateral surface molded against the frame outside surface.

7. The landscape paver of claim 1 wherein the landscape paver defines a paver load receiving surface spaced apart from the panel first surface at least by the paver cover material and further including at least one reduced light transmissivity layer extending transverse to a direction from the paver load receiving surface to the panel first surface, the at least one reduced light transmissivity layer including a light-transmissive material in which is included low-light-transmissivity granular material.

8. The landscape paver of claim 7 wherein the low-light-transmissivity granular material reduces the light transmissivity of the reduced light transmissivity layer by no more than approximately 10%.

9. The landscape paver of claim 7 wherein the low-light-transmissivity granular material is suspended in the reduced light transmissivity layer.

10. The landscape paver of claim 7 wherein the low-light-transmissivity granular material is embedded in the paver load receiving surface.

11. The landscape paver of claim 7 wherein the low-light-transmissivity granular material in at least some of an area of the reduced light transmissivity layer is made up of grains having a maximum dimension of between approximately 10 microns and 7500 microns.

12. The landscape paver of claim 1 wherein the rigid frame includes an electrically conductive material.

13. A landscape paver including:
    (a) a PV panel having a panel first surface and a panel second surface with the panel first surface and the panel second surface bounded by a panel peripheral edge, the PV panel being operable to provide electrical power in response to operating light incident on the panel first surface;
    (b) a frame extending along the panel peripheral edge and having a frame inside surface and a frame outside surface, the frame inside surface together with the panel second surface defining a base volume and the frame outside surface facing away from the base volume;
    (c) a base material located in the base volume, the base material including a base material backing surface and a base material lateral surface, the base material backing surface being molded against at least a portion of the panel second surface so that at least a portion of the base material backing surface is shaped by contact with the panel second surface and the base material lateral surface being molded against at least a portion of the frame inside surface so that at least a portion of the base material lateral surface is shaped by contact with the frame inside surface; and
    (d) a paver cover material extending over the panel first surface, the paver cover material being light-transmissive at least in portions extending over one or more areas of the panel first surface.

14. The landscape paver of claim 13 wherein the landscape paver defines a paver load receiving surface spaced apart from the panel first surface at least by the paver cover material and further including at least one reduced light transmissivity layer extending transverse to a direction from the paver load receiving surface to the panel first surface, the at least one reduced light transmissivity layer including a light-transmissive material in which is included low-light-transmissivity granular material.

15. The landscape paver of claim 14 wherein the low-light-transmissivity granular material is suspended in the reduced light transmissivity layer.

16. The landscape paver of claim 14 wherein the low-light-transmissivity granular material is embedded in the paver load receiving surface.

17. A landscape paver installation including:
    (a) a paver supporting bed;
    (b) two or more landscape pavers supported on the paver supporting bed; and
    (c) wherein a first landscape paver of the two or more landscape pavers includes,
        (i) a PV panel having a panel first surface and a panel second surface with the panel first surface and the panel second surface bounded by a panel peripheral edge, the PV panel being operable to provide electrical power in response to operating light incident on the panel first surface and being supported on the paver supporting bed with the panel first surface facing upwardly;
        (ii) a frame extending along the panel peripheral edge and having a frame inside surface and a frame outside surface, the frame inside surface together with the panel second surface defining a base volume and the frame outside surface facing away from the base volume;
        (iii) a base material located in the base volume, the base material including a base material backing surface and a base material lateral surface, the base material backing surface being molded against at least a portion of the panel second surface so that at least a portion of the base material backing surface is shaped by contact with the panel second surface and the base material lateral surface being molded against at least a portion of the frame inside surface so that at least a portion of the base material lateral surface is shaped by contact with the frame inside surface; and
        (iv) a paver cover material extending over the panel first surface, the paver cover material being light-transmissive at least in portions extending over one or more areas of the panel first surface.

18. The landscape paver installation of claim 17 wherein the first landscape paver defines a paver load receiving surface spaced apart from the panel first surface at least by the paver cover material and further including at least one reduced light transmissivity layer extending transverse to a direction from the paver load receiving surface to the panel first surface, the at least one reduced light transmissivity layer including a light-transmissive material in which is included low-light-transmissivity granular material.

19. The landscape paver installation of claim 18 wherein the low-light-transmissivity granular material is suspended in the reduced light transmissivity layer.

20. The landscape paver installation of claim 18 wherein the low-light-transmissivity granular material is embedded in the paver load receiving surface.

* * * * *